United States Patent [19]
Inamasu

[11] Patent Number: 4,868,571
[45] Date of Patent: Sep. 19, 1989

[54] DIGITAL TO ANALOG CONVERTER

[75] Inventor: Nami Inamasu, Tokyo, Japan

[73] Assignee: NEC Corporation, Tokyo, Japan

[21] Appl. No.: 110,824

[22] Filed: Oct. 21, 1987

[30] Foreign Application Priority Data

Oct. 21, 1986 [JP] Japan .................................. 61-250096

[51] Int. Cl.[4] ............................................. H03M 1/06
[52] U.S. Cl. ...................................... 341/118; 341/145
[58] Field of Search .................. 340/347 CC, 347 DA;
341/118, 131, 144, 145

[56] References Cited

U.S. PATENT DOCUMENTS 4,644,324 2/1987 Araki et al. ................. 340/347 DA

OTHER PUBLICATIONS

The Engineering Staff of Analog Devices, Inc., "Analog-Digital Conversion Notes"; 1977; pp. 118.

Primary Examiner—William M. Shoop, Jr.
Assistant Examiner—Marc S. Hoff
Attorney, Agent, or Firm—Sughrue, Mion, Zinn, Macpeak & Seas

[57] ABSTRACT

In a digital to analog converter, a digital signal is divided into two groups of upper bits and lower bits which are converted to a first and second analog signals respectively. The digital analog converter comprises means for adding a predetermined value of a signal to the lower bits. A carry signal in the addition of the predetermined value is applied to the upper bits. The upper and lower bits of the digital signal thus controlled are converted to a first and second analog signals separately. Thereafter, the two signal are added to produce an analog signal after the second analog signal is attenuated by an attenuating factor depending on the number of the lower bits.

6 Claims, 4 Drawing Sheets

DIGITAL TO ANALOG CONVERTER

FIELD OF THE INVENTION

The invention relates to a digital to analog converter, and more particularly to a digital to analog converter in which two digital to analog converting means are provided to produce two analog signals which are then added to be an analog signal.

BACKGROUND OF THE INVENTION

One of conventional digital to analog (simply called "D/A" hereinafter) converters comprises a first D/A converting means for converting upper four bits of a eight bit digital signal to a first analog signal, a second D/A converting means for converting lower four bits of the eight bit digital signal to a second analog signal, an attenuator for attenuating the second analog signal by an attenuation factor of $\frac{1}{2}^4$, and an adder for adding the first analog signal and the second analog signal which is attenuated.

In operation, the eight bit digital signal is supplied to the first and second D/A converting means by the upper and lower four bits separately so that the first and second analog signals are produced depending upon the contents of the upper and lower four bits. The second analog signal is then attenuated in the attenuator by the attenuation factor of $\frac{1}{2}^4$. Thereafter, the first analog signal and attenuated second analog signal are added so that an analog signal corresponding in its value to the eight bit digital signal is produced.

In the conventional D/A converter, however, there is occured an error at the middle value "zero" (the origin 0 of the coordinate axes) of the analog signal or in the vicinity thereof in a case where, (1) a full scale of the second D/A converting means does not conform to that of the first D/A converting means, (2) there is resulted an error in the attenuated second analog signal due to the characteristic of the attenuator, and (3) a bit which is supplied to the first D/A converting means includes an error.

For these reasons, outputs of analog data are deteriorated in their characteristic, when inputs of digital data are of a value nearly at the origin 0 of the coordinate axes because such Ln error as described above is produced. In such an occasion, the characteristics of S/N ratio or waveform distortion is deteriorated in reproducing audio signal based on a weak power of digital signals.

SUMMARY OF THE INVENTION

Accordingly, it is an object of the invention to provide a digital to analog converter in which an error is eliminated in analog signals to be converted from digital signals, even if the digital signals are of small levels.

It is an object of the invention to provide a digital to analog converter which is not increased in its manufacturing cost, even if the characteristic of eliminating an error in analog signals is added thereto.

According to the invention, a digital to analog converter comprises, means for adding a predetermined value of a signal to a digital signal to produce a controlled digital signal, means for converting upper bits of said controlled digital signal to a first analog signal, said upper bits being an upper group of two groups into which said controlled digital signal is divided, means for converting lower bits of said controlled digital signal to a second analog signal, said lower bits being a lower group of said two groups, means for attenuating said second analog signal by a predetermined attenuating factor depending on the number of said lower bits to produce an attenuated analog signal, and means for producing an analog signal in accordance with the addition of said first analog signal and attenuated second analog signal.

BRIEF DESCRIPTION OF THE DRAWINGS

The invention will be explained in more detail in accordance with following drawings wherein.

DESCRIPTION OF THE PREFERRED EMBODIMENT

Figure 1:
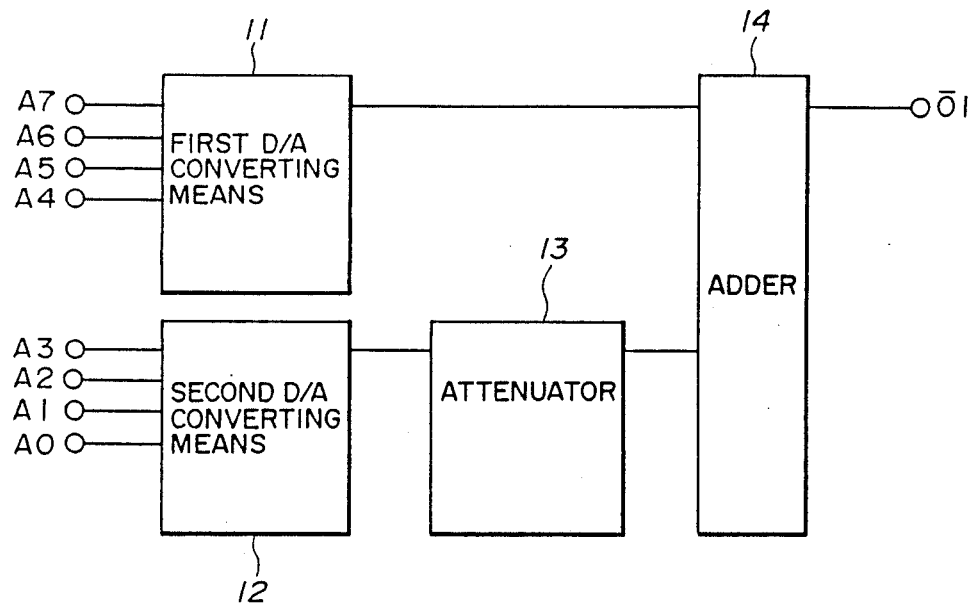
FIG. 1 is a block diagram showing a conventional digital to analog converter.

Before describing a digital to analog converter according to the invention, a conventional digital to analog converter as briefly described before will be described in FIG. 1. The conventional digital to analog converter comprises a first D/A converting means 11 for converting upper four bits of an eight bit digital signal to be supplied to input terminals A4 to A7 to a first analog signal, a second D/A converting means 12 for converting lower four bits of the eight bit digital signal to be supplied to input terminals A0 to A3 to a second analog signal, an attenuator 13 for attenuating the second analog signal by an attenuation factor of $\frac{1}{2}^4$ such that a scaling is performed between the first and second D/A converting means, and an adder 14 for adding the first analog signal and attenuated second analog signal to produce an analog signal at an output terminal $\overline{01}$ thereof.

In operation, when such an eight bit digital signal as including "high" and "low" bits is applied to the input terminals A0 to A7, the first analog signal corresponding to the upper four bits of the digital signal is produced in the first D/A converting means 11, while the second analog signal corresponding to the lower four bits of the digital signal is produced in the second D/A converting means 12. The second analog signal which is supplied from the second D/A converting means 12 is attenuated in the attenuator 13 by the attenuating factor factor $\frac{1}{2}^4$ because the second analog signal must be of $\frac{1}{2}^4$ in regard to the first signal. The first analog signal and attenuated second signal are added in the adder 14 to produce the analog signal at the output terminal $\overline{01}$.

According to the conventional digital to analog converter, however, there is occured a remarkable error in the vicinity of the origin 0 of the coordinate axes, that is, a digital input "10000000" (binary) as shown in FIGS.

Figure 2A:
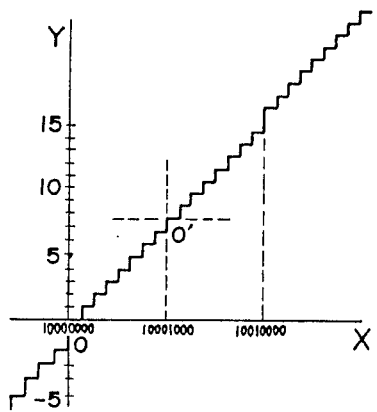
FIGS. 2A and 2B are explanatory diagrams showing relations between digital and analog signals.

2A and 2B wherein the X axis indicates digital inputs, while the Y axis indicates analog outputs. The error is resulted from an error of steps based on a difference of characteristics between the first and second D/A converting means 11 and 12, for instance, in a case where the digital inputs are changed from "0111" to "1000" in the first D/A converting means 11, and from "1111" to "0000" in the second D/A converting means 12, when a signal is changed from "−1" to "0", that is, the digital input is changed from "01111111" to "10000000". In FIG. 2A, the errors are produced where a scaling of the first D/A converting means 11 is slightly bigger than that of the second D/A converting means 12. On the other hand, the errors are produced in FIG. 2B where the scaling of the second D/A converting means 12 is slightly bigger than that of the first D/A converting means 11.

Figure 2B:
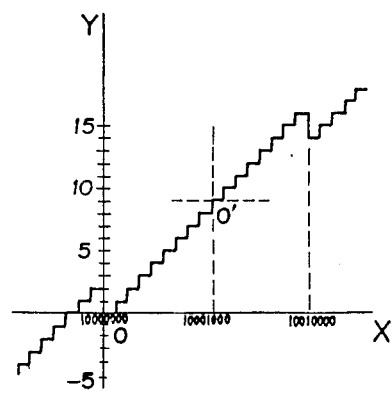

If such very small digital signals as being −1, 0 and 1 like audio signals the center of which is positioned at the origin 0 are applied to the input terminals A0 to A7, analog signals of −2, 0 and 1 are produced at the output terminal $\overline{O1}$ in FIG. 2A, while analog signals of 2, 0 and 1 are produced in FIG. 2B so that much bigger errors or distortion is produced in the conventional digital to analog converter.

Figure 3:
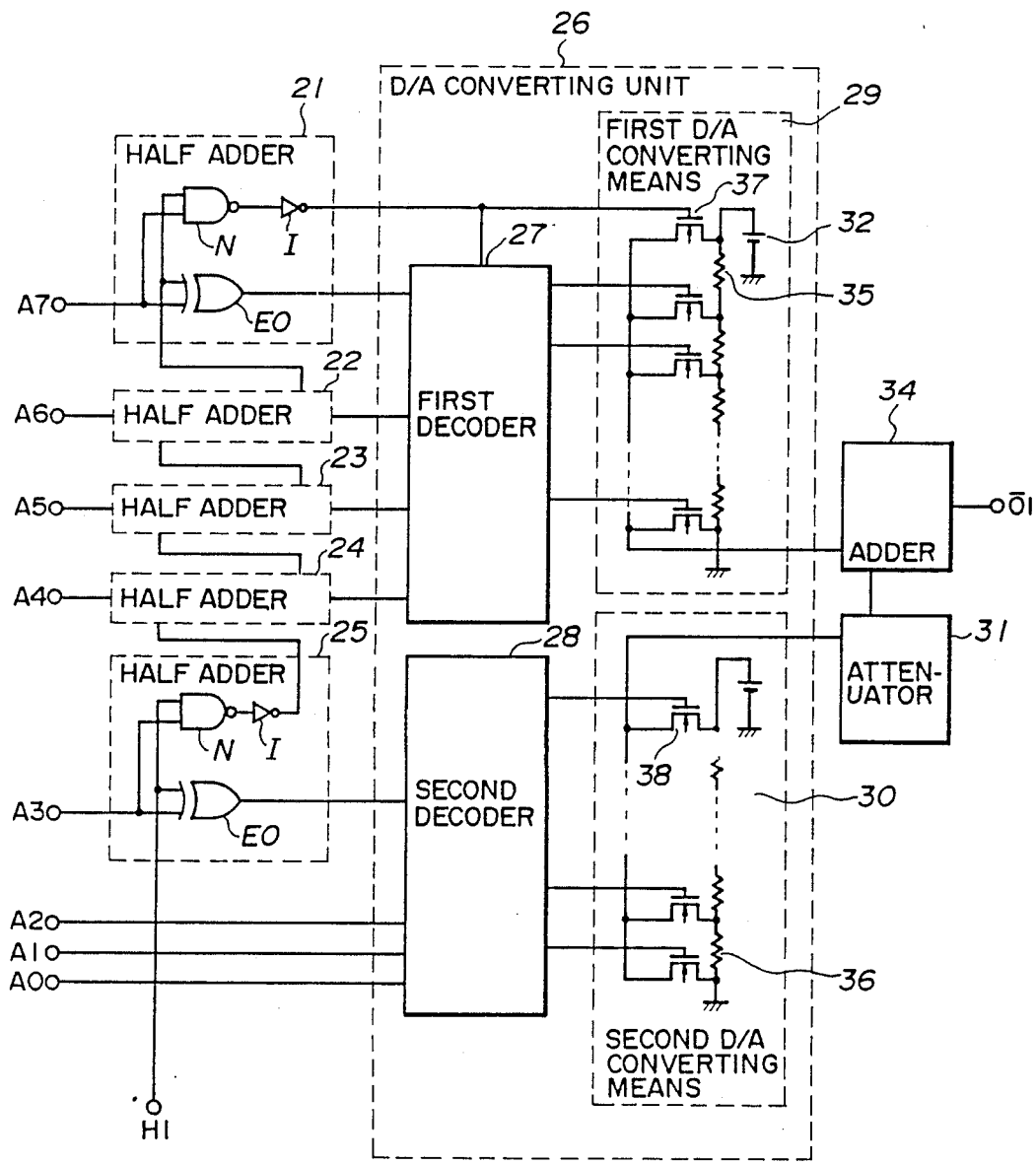
FIG. 3 is a block diagram showing a digital to analog converter in the first embodiment according to the invention.

Next, there is shown a digital to analog converter in a first embodiment according to the invention in FIG. 3. The digital to analog converter comprises half adders 21 to 25, a D/A converting unit 26, an attenuator 31, and an adder 34. Each of the half adders 21 to 25 includes an exclusive OR circuit EO which is connected to one of input terminals A3 to A7, a NAND circuit N which is also connected to one of the input terminals A3 to A7, and an inverter I which is connected to the output terminal of the NAND circuit N. In each of the half adders 22 to 25, the output of the inverter I is applied to remaining inputs of the exclusive OR circuit EO and NAND circuit N in a following half adder, while the output of the inverter I of the half adder 21 is supplied to the D/A converting unit 26. In the half adder 25, on the other hand, the control signal "high" is applied to one of the inputs of the NAND circuit N from a control terminal H1. The D/A converting unit 26 includes a first and second decoders 27 and 28, and a first and second D/A converting means 29 and 30. The first decoder 27 is connected to the respective exclusive OR circuits EO of the half adders 21 to 24 and to the inverter I of the half adder 21, while the second decoder 28 is connected to the exclusive OR circuit of the half adder 25 and to input terminals A0 to A2. The first D/A converting means 29 includes a DC voltage source 32, sixteen of resistances 32, and seventeen of transistors 37, while the second D/A converting means 30 includes a DC voltage source 33, fifteen of resistance 36, and sixteen of transistors 38. In the first D/A converting means 29, the lower sixteen of the transistor 37 are connected to the output terminals of the first decoder 27, while the remaining one of the transistors 37 is connected to the inverter I of the half adder 21. The common connecting point of the transistors 37 is connected to the adder 34 having an output terminal $\overline{O1}$. In the second D/A converting means 30, the transistors 38 are connected to the respective output terminals of the second decoder 28. The common connecting point of the transistors 38 is connected to the input of the attenuator 31 which is connected to the adder 34 at the output thereof.

In operation, when such an eight bit digital signal as including "high" and "low" bits is applied to the input terminals A0 to A7, upper five bits thereof are received in the half adders 21 to 25, and lower three bits thereof are received at the lower three inputs of the second decoder 28. In the half adder 25, the following addition is performed.

| INPUT | | OUTPUT | |
|---|---|---|---|
| A3 | H1 | E0 | I |
| 0 | 1 | 1 | 0 |
| 1 | 1 | 0 | 1 |

As clearly understood from the above table, a carry signal which is the output of the inverter I is produced, when a bit of the input terminal A3 is "high" so that a signal "high" is applied to the exclusive OR circuit EO and NAND circuit N in the following half adder 24 whereby the same addition as mentioned above is performed therein. Such adding operations are repeated in the half adder 24 to 21. In this calculation, digital data which are applied to the input terminals A0 to A7 and fixed digital data "1000" (binary) based on the control signal applied to the control terminal H1 are added to produce a nine bit digital signal wherein a highest bit thereof is supplied to the first decoder 27, and to the corresponding one of the transistors 37 of the first D/A converting means 29, the middle four bits thereof are supplied from the half adders 21 to 24 to the first decoder 27, and the lower four bits thereof are supplied from the half adder 25 and input terminals A0 to A2 to the second decoder 28. In each of the first and second decoders 27 and 28, one of output terminals thereof is selected to be "high" dependent on a content of input bits so that the respective ones of transistors 37 and 38 are turned on in each of the first and second D/A converting means 29 and 30. In the first decoder 27, none of the output terminals is selected, when the output of the inverter I is "high" in the half adder 21. As a result, a first analog signal which is one of seventeen analog values in the first D/A converting means 29 is produced to be supplied to the adder 34, while a second analog signal which is one of sixteen analog values in the second D/A converting means 30 is produced to be supplied to the attenuator 31. The second analog signal is attenuated in the attenuator 31 by an attenuating factor of $\frac{1}{2}^4$. Finally, the first analog signal and second analog signal thus attenuated are added to produce an analog signal at the output terminal $\overline{O1}$.

As described above, the fixed value "1000" is added to the digital data applied to the input terminals A0 to A3 so that the origin 0 of the coordinate axes X and Y is shifted to the origin 0' as shown in FIGS. 2A and 2B. As clearly shown in FIGS. 2A and 2B, there is substantially occured no error at the shifted origin 0' or in the vicinity thereof so that the characteristic of S/N ratio or distortion of waveform can be improved.

To be more concrete, when a digital signal to be applied to the input terminals A0 to A7 is at the origin 0, that is, "10000000", the input signal to be applied to the D/A converting unit 26 becomes "10001000" by the addition mentioned above. Further, when the input digital signal is −1, that is, "01111111", the added digital signal becomes "10000111". In other words, even if the digital data to be applied to the input terminals A0 to A7 are −1, 0 and 1, the input signals to be supplied to the D/A converting means 26 are only changed to be "10000111", "10001000", and "10001001". This means that there is no change in the data to be supplied through the first decoder 27 to the first D/A converting means 29. While, an error can be prevented from being induced in the second converting means 30 because a monotonous characteristic of the changing amount can be provided therein by use of a resistance string type of a digital analog converting means as adopted in the embodiment, although the input data to be supplied to the second D/A converting means 30 are changed to be "0111", "1000", and "1001".

Figure 4:
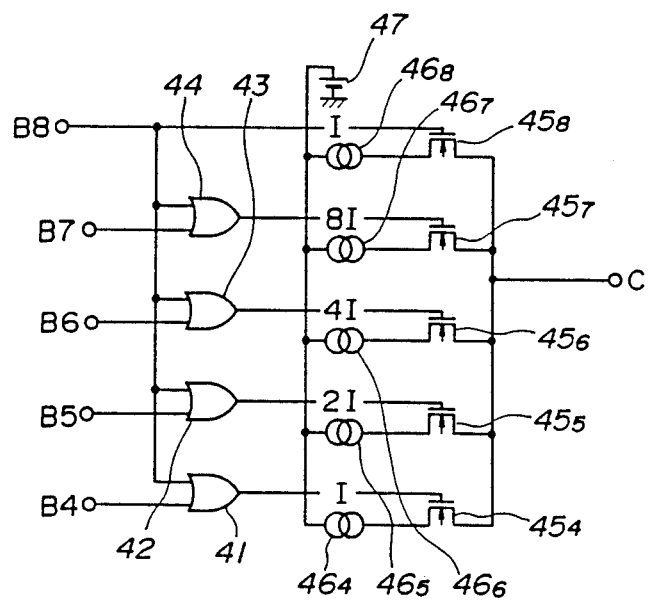
FIG. 4 is an explanatory diagram showing a circuit which can be in place of a decoder and first D/A converting means in the digital to analog converter in the first embodiment according to the invention.

FIG. 4 shows a D/A converting means which can be in place of the first decoder 27 and first D/A converting means 29 in FIG. 3. The D/A converting means comprises input terminals B4 to B8 which are connected to the output terminals of the half adders 22 to 25 and two output terminals of the half adder 21 in FIG. 3 respectively, OR circuits 41 to 44 which are connected to the input terminals B4 to B7 respectively and to the input terminal B8, transistors $45_4$ to $45_8$ which are turned on by outputs of the OR circuits 41 to 44 and signal of the input terminal B8 respectively, current sources $46_4$ to $46_8$ which produce fixed current values of I, 2I, 4I, 8I and I respectively, and a DC voltage sources 47 from which a predetermined DC voltage is applied to the current sources $46_4$ to $46_8$.

In operation, when an input signal applied to the input terminals B4 to B8 is, for instance, "00010", an analog signal 2I is produced at the output terminal C because the transistor $45_5$ is turned on by the output of the OR circuit 42. On the other hand, when the input signal applied to the input terminals B4 to B8 is "10000", an analog signal 16I is produced at the output terminal C because all of the transistors $45_5$ to $45_8$ are turned on. The analog signal thus produced at the output terminal C is supplied to the adder 34 in FIG. 3 as described before.

Figure 5:
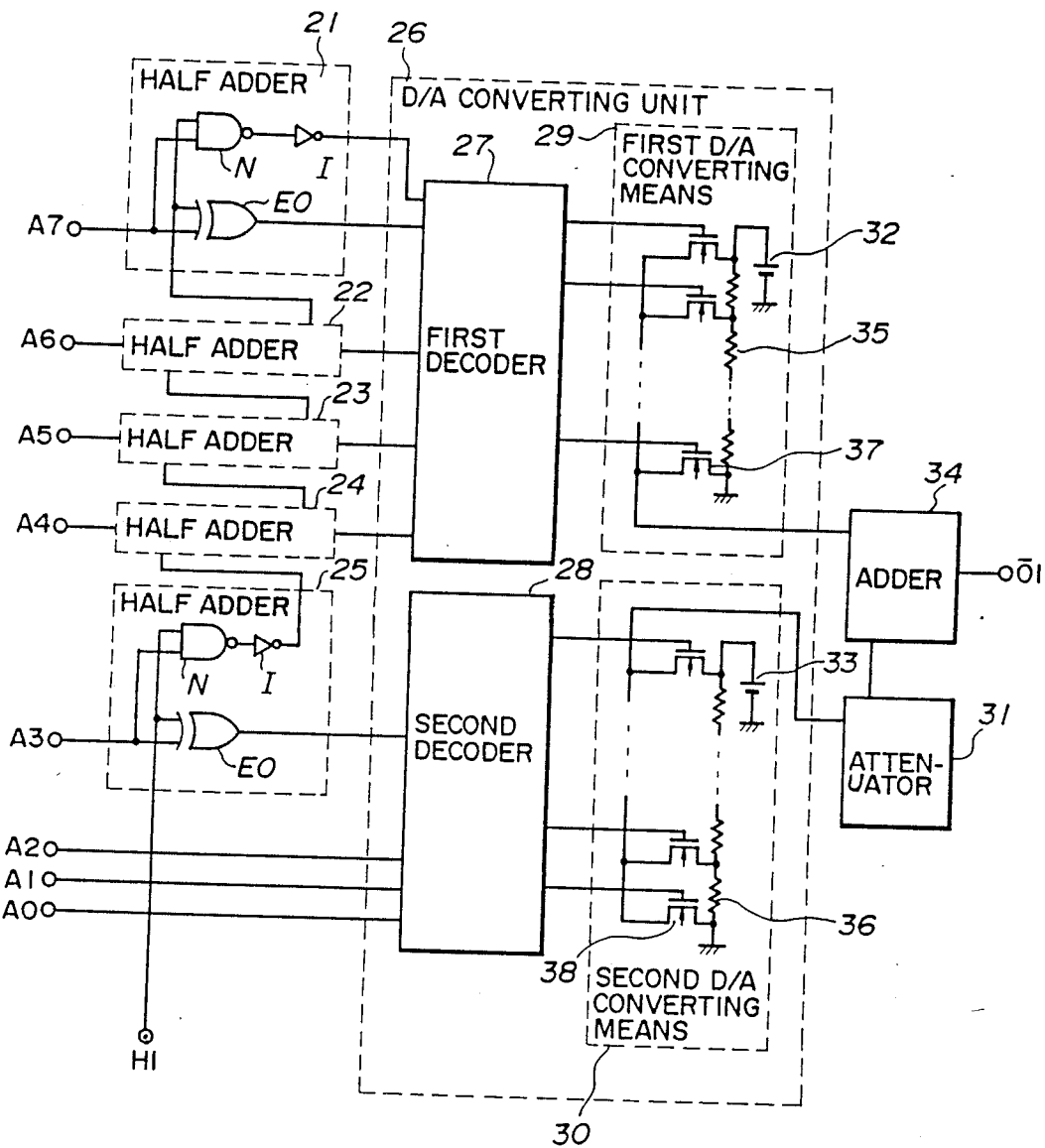
FIG. 5 is a block diagram showing a digital to analog converter in the second embodiment according to the invention.

FIG. 5 shows a digital to analog converter in the second embodiment according to the invention wherein like reference numerals indicate like parts as shown in FIG. 3. The digital to analog converter is different from one in the first embodiment only in the construction that the first decoder 27 is provided with five input terminals and thirty-two output terminals in the second embodiment. Accordingly, the output of the inverter I is supplied to the decoder 27, and thirty-two of the transistor 37 are provided in the first D/A converting means 29.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A digital to analog converter comprising: means for adding to a digital signal, having upper bits and lower bits, a "1" to the most significant bit of said lower bits to produce a controlled digital signal,
   means for converting the upper bits of said controlled digital signal to a first analog signal, said upper bits being an upper group of two groups into which said controlled digital signal is divided,
   means for converting the lower bits of said controlled digital signal to a second analog signal, said lower bits being a lower group of said two groups,
   means for attenuating said second analog signal by a predetermined attenuating factor depending on the number of said lower bits to produce an attenuated analog signal, and
   means for producing an analog signal in accordance with the addition of said first analog signal and attenuated second analog signal.

2. A digital to analog converter according to claim 1, wherein said means for adding to a digital signal includes a half adder which is connected to an input terminal for the most significant bit of said lower bits, and half adders which are connected to input terminals for all of said upper bits such that a carry signal of said half adder for said lower bits is applied to one of said half adders which is for the least significant bit of said upper bits, carry signals of said half adders are applied to one of said half adders for an upper bit of said upper bits by one bit in turn, whereby an output of said half adder of said lower bits and digital signals of input terminals excluding the most significant bit of said lower bits are applied to said means for converting said lower bits, and outputs of said half adders of said upper bits and a carry signal of one of said half adders which is for the most significant bit of said upper bits are applied to said means for converting said upper bits.

3. A digital to analog converter according to claim 1, wherein said means for adding produces said controlled digital signal, said upper bits of which are increased in the number of bits by one bit,
   said means for converting said upper bits includes a decoder for decoding said upper bits excluding the most significant bit thereof to produce a first decoded signal, and a digital to analog converting means for producing said first analog signal in accordance with said first decoded signal and most significant bit of said upper bits, and
   said means for converting said lower bits includes a decoder for decoding said lower bits to produce a second decoded signal, and a digital to analog converting means for producing said second analog signal in accordance with said second decoded signal.

4. A digital to analog converter according to claim 1, wherein said means for converting said upper bits includes a plurality of current sources equal in the number thereof to said upper bits, said plurality of said current sources being turned on the content of said upper bits and the current amount thereof being changed depending on the position in regard to said upper bits.

5. A digital analog converter according to claim 1, wherein said means for adding produces said controlled digital signal, said upper bits of which are increased in the number of bits by one bit,
   said means for converting said upper bits includes a decoder for decoding said upper bits to produce a decoded signal, and a digital to analog converting means for producing said first analog signal in accordance with said decoded signal.

6. A digital to analog converter comprising,
   n (n=8, 16, 32 . . . ) input terminals to which a digital signal of n bits is applied,
   a half adder for adding "1" to the most significant bit of the lower n/2 bits of said digital signal,
   n/2 half adders connected correspondingly to n/2 input terminals of said n input terminals corresponding to upper n/2 bits of said digital signal, one of said n/2 half adders corresponding to the least significant bit of the upper n/2 bits being supplied with a carry from said half adder for adding, and the remaining half adders of said n/2 half adders being respectively supplied with a carry from a half adder corresponding to a lower bit by one bit, a lower bit converting unit for converting a lower bit digital signal to a lower analog signal, said lower bit digital signal being composed of an output of said half adder for adding said lower (n/2−1) bits excluding said most significant bit of said n/2 bits of said digital signal, an upper bit converting unit for converting an upper bit digital signal to an upper analog signal, said upper bit digital signal being composed of n/2 outputs of said n/2 half adders and an output of a carry terminal of a half adder corresponding to the most significant bit of said upper n/2 bits among n/2 half adders, an attenuator for attenuating said lower analog signal by a predetermined attenuating factor depending on the bit number of n/2 to produce an attenuated analog signal, and an adder for adding said upper analog signal and said attenuated analog signal to produce an analog signal.

* * * * *

UNITED STATES PATENT AND TRADEMARK OFFICE
CERTIFICATE OF CORRECTION

PATENT NO. : 4,868,571

DATED : September 19, 1989

INVENTOR(S) : Inamasu

It is certified that error appears in the above-identified patent and that said Letters Patent is hereby corrected as shown below:

Column 1, line 48, delete "Ln" and insert --an--.

Column 2, line 25, delete "decorder" and insert --decoder--.

Signed and Sealed this

Nineteenth Day of February, 1991

*Attest:*

HARRY F. MANBECK, JR.

*Attesting Officer*  *Commissioner of Patents and Trademarks*